(12) United States Patent
Mayumi et al.

(10) Patent No.: US 9,714,344 B2
(45) Date of Patent: *Jul. 25, 2017

(54) ULTRAVIOLET-RAY-CURABLE ORGANOPOLYSILOXANE COMPOSITION, AND METHOD FOR PRODUCING PRINTING MATERIAL

(71) Applicant: SHIN-ETSU CHEMICAL CO., LTD., Tokyo (JP)

(72) Inventors: Yuka Mayumi, Annaka (JP); Masayuki Ikeno, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/022,724

(22) PCT Filed: Aug. 19, 2014

(86) PCT No.: PCT/JP2014/071598
§ 371 (c)(1),
(2) Date: Mar. 17, 2016

(87) PCT Pub. No.: WO2015/056483
PCT Pub. Date: Apr. 23, 2015

(65) Prior Publication Data
US 2016/0230005 A1 Aug. 11, 2016

(30) Foreign Application Priority Data
Oct. 18, 2013 (JP) .................. 2013-217177

(51) Int. Cl.
| | |
|---|---|
| C08F 2/46 | (2006.01) |
| C08F 2/50 | (2006.01) |
| C08G 61/04 | (2006.01) |
| C08L 83/04 | (2006.01) |
| B29C 59/00 | (2006.01) |
| B29C 67/00 | (2017.01) |
| G03F 7/00 | (2006.01) |
| G03F 7/075 | (2006.01) |
| B33Y 10/00 | (2015.01) |
| B33Y 80/00 | (2015.01) |
| B29K 83/00 | (2006.01) |
| B29L 7/00 | (2006.01) |

(52) U.S. Cl.
CPC ............ C08L 83/04 (2013.01); B29C 59/002 (2013.01); B29C 67/0011 (2013.01); B29C 67/0051 (2013.01); G03F 7/0002 (2013.01); G03F 7/0757 (2013.01); B29K 2083/00 (2013.01); B29L 2007/001 (2013.01); B33Y 10/00 (2014.12); B33Y 80/00 (2014.12); C08L 2312/06 (2013.01)

(58) Field of Classification Search
CPC ...... C08L 83/04; C08L 83/00; C08L 2312/06; B29C 67/0051; B29C 67/0011; B29C 59/002; B33Y 10/00; B33Y 80/00

USPC ................. 522/66, 6, 71, 189, 184, 1; 520/1
See application file for complete search history.

(56) References Cited

U.S. PATENT DOCUMENTS

| | | |
|---|---|---|
| 5,952,397 A | 9/1999 | Fujiki et al. |
| 6,274,692 B1 | 8/2001 | Herzig et al. |
| 2007/0269586 A1 | 11/2007 | Leatherdale et al. |
| 2008/0033071 A1 | 2/2008 | Irmer et al. |
| 2009/0062417 A1 | 3/2009 | Wrobel et al. |

(Continued)

FOREIGN PATENT DOCUMENTS

| | | |
|---|---|---|
| EP | 2582214 A2 | 4/2013 |
| JP | 2007-510517 A | 8/2000 |
| JP | 3417230 B2 | 6/2003 |
| JP | 2005-194474 A | 7/2005 |
| JP | 2008-508382 A | 3/2008 |
| JP | 2009-537991 A | 10/2009 |
| JP | 2009-543708 A | 12/2009 |
| JP | 2010-47646 A | 3/2010 |
| JP | 2010-537018 A | 12/2010 |
| JP | 4788863 B2 | 10/2011 |
| JP | 2012-74644 A | 4/2012 |
| JP | 2013-938 A | 1/2013 |
| JP | 5168510 B2 | 3/2013 |
| WO | WO 2007/145711 A1 | 12/2007 |
| WO | WO 2012/055735 A1 | 5/2012 |

OTHER PUBLICATIONS

International Search Report, issued in PCT/JP2014/071598, mailed Dec. 2, 2014.

(Continued)

*Primary Examiner* — Jessica E Whiteley
(74) *Attorney, Agent, or Firm* — Birch, Stewart, Kolasch & Birch, LLP

(57) ABSTRACT

The present invention pertains to an ultraviolet-ray-curable organopolysiloxane composition containing: (A) (A-1) a straight-chain organopolysiloxane containing an alkenyl group, and (A-2) a three-dimensional-network-shaped organopolysiloxane resin containing an $R^1_2R^2SiO_{1/2}$ unit, an $R^1_3SiO_{1/2}$ unit, an $SiO_2$ unit, and an alkenyl group; (B) an organohydrogenpolysiloxane; (C) a photoactive platinum complex curing catalyst; and (D) an organopolysiloxane oligomer containing an $R^1_2R^2SiO_{1/2}$ unit or the $R^1_2R^2SiO_{1/2}$ unit and an $R^1_3R^2SiO_{1/2}$ unit, also containing an $R^1SiO_{3/2}$ unit, not containing an $SiO_2$ unit, and also containing an alkenyl group. As a result, this ultraviolet-ray-curable organopolysiloxane composition retains high strength and does extremely well suppressing heat-induced expansion or contraction; hence, it is possible to transfer a pattern and print with high dimensional accuracy.

6 Claims, No Drawings

(56) References Cited

U.S. PATENT DOCUMENTS

2009/0115075 A1    5/2009   Kessel et al.
2013/0200554 A1    8/2013   Mueller
2015/0124338 A1*   5/2015   Mayumi ............ G02B 19/0009
                                                                                        359/742

OTHER PUBLICATIONS

European Patent Office Communication and extended search report issued in the corresponding European Patent Application No. 14853853.1 on May 23, 2017.

* cited by examiner

ULTRAVIOLET-RAY-CURABLE ORGANOPOLYSILOXANE COMPOSITION, AND METHOD FOR PRODUCING PRINTING MATERIAL

TECHNICAL FIELD

The present invention relates to an ultraviolet-curable organopolysiloxane composition. More particularly, the invention relates to an ultraviolet-curable organopolysiloxane composition which cures into a rubbery state and is suitable for use as plate material (printing material), examples of which include materials that transfer an uneven surface pattern, such as nanoimprint master materials used as a master for pressing a photocurable resin or the like and thereby inverting a fine pattern; pad materials which are used for printing on curved surfaces and which transfer a conductive ink or semiconductive ink to form a fine pattern; blanket materials for offset printing; and shape-forming materials for 3D printers.

In this invention, "plate material" refers to any of the following obtained by pouring a UV-curable organopolysiloxane composition in an uncured state over a matrix having a fine pattern formed thereon, exposing the composition to UV radiation by a stereolithographic process and thus effecting a cure, and removing the cured composition from the matrix to give a material in which the fine pattern has been inverted: nanoimprint master materials, pad materials for printing on curved surfaces, blanket materials for offset printing that have been cured on a substrate of high planarity (e.g., a glass substrate), and shape-forming materials for 3D printers.

BACKGROUND ART

Silicone rubbers have hitherto been widely used in a variety of fields by exploiting their excellent heat resistance, cold resistance, electrical properties and other characteristics. In particular, given their good flow properties and their ability to invert, with good dimensional reproducibility, a fine pattern from a matrix, they have attracted attention as nanoimprint master materials, pad materials for printing on cured surfaces, blanket materials for offset printing and shape-forming materials for 3D printers. From the standpoint of dimensional reproducibility and workability in particular, frequent use has come to be made of addition reaction-curable liquid silicone rubber compositions. However, conventional addition-curable liquid silicone rubbers, which are used to invert a fine pattern by casting the uncured silicone rubber composition onto a matrix and then heat-curing the composition, have relied on the material and dimensional accuracy of the matrix.

Specifically, the matrix is generally created by a process that uses photolithography to form a fine pattern on a silicon wafer. However, because the largest silicon wafers available commercially today have a diameter of 300 mm, it has not been possible to produce plate materials for large microcontact prints of A4 size (210 mm×297 mm), for example.

Hence, to create the matrix, methods of forming a fine pattern with a resist material or the like on a glass substrate have been proposed, but the pattern accuracy has tended to be poor compared with a matrix produced on a silicon wafer using photolithography.

Silicone rubber compositions for use in making nanoimprint plate materials are generally supplied in the form of a composition containing an organopolysiloxane having a high degree of polymerization and a reinforcing resin. Such a composition is prepared by using a mixing device such as universal mixer or kneader to mix the reinforcing resin and various dispersants into a starting polymer. Addition-curable liquid silicone rubber compositions are typically cured by the application of heat, but the resulting silicone rubber composition and the silicone rubber which is the cured form thereof end up swelling or shrinking under the effect of heat. This has led to problems such as the inability to transfer or print patterns of prescribed dimensions, particularly in fine pattern inversion during the nanoprinting of photocurable resins, and also in pad materials used for printing on curved surfaces and blanket materials used in offset printing.

Acrylic-modified UV-curable silicone resins are sometimes used today in stereolithography. UV-curable silicone resins are generally free-radical crosslinked, and so one drawback has been inhibition of the cure by oxygen. Silicone compositions differ from other organic resins in that the high oxygen permeability distinctive to silicones gives rise to a cure-suppressing effect, ensuring storage stability when left open to the atmosphere.

However, because locally removing in a short time the oxygen diffused throughout the silicone resin is difficult, crosslinking in the UV-irradiated areas is unstable and interfaces between exposed areas and non-exposed areas after the cure are unstable, making fabrication at a high dimensional accuracy a challenge.

Moreover, in the case of layer-by-layer fabrication, unless light leakage from UV-irradiated sites is shielded with an ultraviolet absorber or a light-blocking pigment, the edges become indistinct. But, such shielding detracts from the inherent transparency of the silicone resin, limiting applications.

In UV-curable silicone resins, the addition-curing reaction is obtained using a platinum catalyst activated by exposure to UV radiation. The catalyst used has a high reactivity in the wavelength range of 200 to 400 nm, and light absorbance by the siloxane polymer serving as the base resin rises at a wavelength of about 250 nm. Generally, in stereolithography using acrylic or urethane-type UV-curable resins, when the g-line (436 nm) or shorter wavelength light is used as the light source, light leakage from the beam spot (the light-exposed region that forms on the liquid surface) is absorbed by the base resin, enabling sharp edges to form. However, in the case of UV-curable silicone resins such as acrylic-modified silicone resins, the base resin retains transmissivity even to the i-line (365 nm), and so light leakage from the beam spot is unavoidable, resulting in a lack of edge sharpness.

The following prior-art literature relates to this invention. Patent Document 1 (JP-A 2012-74644) discloses a plate material for microcontact printing which has a reduced content of low-molecular-weight siloxane, but a drawback is that mercapto-modified UV-curable silicone resins have a poor heat resistance. A system in which the cured form of a fluorinated polyether skeleton-containing fluororubber composition has been deposited as a layer over the surface of a silicone rubber composition (Patent Document 2: JP No. 5168510) undergoes thermal expansion under heating, making pattern transfer at a good dimensional accuracy difficult.

Patent Document 3 (JP No. 3417230) and Patent Document 4 (JP No. 4788863) disclose instances where acrylic-modified UV-curable silicone resins are used in stereolithography. However, because oxygen removal is not easy, after crosslinking of the irradiated areas or after curing of the exposed and non-exposed areas, the interfaces become unstable, making fabrication at a high dimensional accuracy difficult.

SUMMARY OF THE INVENTION

Problems to be Solved by the Invention

In light of the above, an object of the invention is to provide a UV-curable organopolysiloxane composition which has sufficient strength as a printing material such as a master material for nanoimprinting, a pad material for printing on curved surfaces, a blanket material for offset printing or a shape-forming material for 3D printing, and yet can suppress thermal expansion due to heating, thus making it effective for obtaining master materials for nanoimprinting, pad materials for printing on curved surfaces, blanket materials for offset printing and shape-forming materials for 3D printing that enable pattern transfer and printing at a good dimensional accuracy.

Means for Solving the Problems

As a result of extensive investigations, the inventors have discovered that by providing photocurable addition reaction-type organopolysiloxane compositions and the cured forms thereof which, in terms of polymer design, have the advantage of high dimensional accuracy after curing by way of an addition reaction and which moreover cure rapidly under exposure to UV radiation, it is possible to obtain master materials for nanoimprinting, pad materials for printing on curved surfaces, blanket materials for offset printing and shape-forming materials for 3D printing which are endowed with sufficient strength and enable pattern transfer and printing at a good dimensional accuracy.

Accordingly, the invention provides the following UV-curable organopolysiloxane composition and the following plate material and method of production thereof.

[1] A UV-curable organopolysiloxane composition comprising:

(A) 100 parts by weight of (A-1) 50 to 90% by weight, based on component (A), of a linear organopolysiloxane containing at least two silicon atom-bonded alkenyl groups per molecule, and (A-2) 10 to 50% by weight, based on component (A), of a three-dimensional network-type organopolysiloxane resin comprising $R^1_2R^2SiO_{1/2}$ units, $R^1_3SiO_{1/2}$ units and $SiO_2$ units (wherein $R^1$ is an unsubstituted or halogen-substituted monovalent hydrocarbon group exclusive of alkenyl, and $R^2$ is an alkenyl group) in a molar ratio of the sum of $R^1_2R^2SiO_{1/2}$ units and $R^1_3SiO_{1/2}$ units to $SiO_2$ units, expressed as $(R^1_2R^2SiO_{1/2}+R^1_3SiO_{1/2})/SiO_2$, of from 0.5 to 1.5, and containing from $1\times10^{-4}$ to $50\times10^{-1}$ mol/g of alkenyl groups, the sum of components (A-1) and (A-2) being 100% by weight;

(B) an organohydrogenpolysiloxane containing at least two silicon atom-bonded hydrogen atoms per molecule but no alkoxy groups, in an amount that gives a molar ratio of silicon atom-bonded hydrogen atoms in component (B) to the sum of alkenyl groups in components (A) and (D) of from 0.5 to 6.0;

(C) an effective amount of a photoactive platinum complex curing catalyst; and (D) an alkenyl group-containing organopolysiloxane oligomer comprising $R^1_2R^2SiO_{1/2}$ or $R^1_2R^2SiO_{1/2}$ and $R^1_3SiO_{1/2}$ units, and $R^1SiO_{3/2}$ units (wherein $R^1$ is an unsubstituted or halogen-substituted monovalent hydrocarbon group exclusive of alkenyl, and $R^2$ is an alkenyl group) but no $SiO_2$ units, in an amount that gives a molar ratio of alkenyl groups in component (D) to the sum of alkenyl groups in components (A) and (D) of from 0.01 to 0.6.

[2] The UV-curable organopolysiloxane composition of [1], wherein the photoactive platinum complex catalyst is a β-diketone platinum complex or a platinum complex having a cyclic diene compound as a ligand.

[3] The UV-curable organopolysiloxane composition of [2], wherein the photoactive platinum complex catalyst is one or more selected from the group consisting of trimethyl(acetylacetonato)platinum complex, trimethyl(2,4-pentanedionate)platinum complex, trimethyl(3,5-heptanedionate)platinum complex, trimethyl(methylacetoacetate)platinum complex, bis(2,4-pentanedionato)platinum complex, bis(2,4-hexanedionato)platinum complex, bis(2,4-heptanedionato)platinum complex, bis(3,5-heptanedionato)platinum complex, bis(1-phenyl-1,3-butanedionato)platinum complex, bis(1,3-diphenyl-1,3-propanedionato)platinum complex, (1,5-cyclooctadienyl)dimethyl platinum complex, (1,5-cyclooctadienyl)diphenyl platinum complex, (1,5-cyclooctadienyl)dipropyl platinum complexes, (2,5-norbornadiene)dimethyl platinum complex, (2,5-norbornadiene)diphenyl platinum complex, (cyclopentadienyl)dimethyl platinum complex, (methylcyclopentadienyl)diethyl platinum complex, (trimethylsilylcyclopentadienyl)diphenyl platinum complex, (methylcycloocta-1,5-dienyl)diethyl platinum complex, (cyclopentadienyl)trimethyl platinum complex, (cyclopentadienyl)ethyldimethyl platinum complex, (cyclopentadienyl)acetyldimethyl platinum complex, (methylcyclopentadienyl)trimethyl platinum complex, (methylcyclopentadienyl)trihexyl platinum complex, (trimethylsilylcyclopentadienyl)trimethyl platinum complex, (dimethylphenylsilylcyclopentadienyl)triphenyl platinum complex and (cyclopentadienyl)dimethyltrimethylsilylmethyl platinum complex.

[4] The UV-curable organopolysiloxane composition of [1], [2] or [3] which is for use in forming a master material for nanoimprinting, a pad material for printing on a curved surface, a blanket material for offset printing or a shape-forming material for 3D printing.

[5] A method for producing a plate material selected from the group consisting of a master material for nanoimprinting, a pad material for printing on a curved surface, a blanket material for offset printing and a shape-forming material for 3D printing, the method comprising the steps of applying the UV-curable organopolysiloxane composition of [1], [2] or [3] to a matrix on which is formed a fine pattern to be inverted; irradiating the applied organopolysiloxane composition with UV radiation to effect curing by a stereolithographic process; and removing the cured composition from the matrix, thereby inverting and forming the fine pattern of the matrix on the surface of the cured composition.

[6] A plate material selected from the group consisting of a master material for nanoimprinting, a pad material for printing on a curved surface, a blanket material for offset printing and a shape-forming material for 3D printing, wherein the plate material comprises the UV-curable organopolysiloxane of [1], [2] or [3] in a cured form having a linear shrinkage of not more than 0.5%.

Advantageous Effects of the Invention

The inventive UV-curable organopolysiloxane composition for use in forming a printing material such as a master material for nanoimprinting, a pad material for printing on a curved surface, a blanket material for offset printing or a shape-forming material for 3D printing, retains a high strength and largely suppresses heat-induced expansion and shrinkage, enabling pattern transfer and printing at a high dimensional accuracy.

EMBODIMENT FOR CARRYING OUT THE INVENTION

The invention is described more fully below.

[Component (A)]

Component (A) is an alkenyl group-containing organopolysiloxane consisting of (A-1) an alkenyl group-containing linear diorganopolysiloxane and (A-2) an alkenyl group-containing organopolysiloxane resin.

Component (A-1), an organopolysiloxane serving as the base polymer of the composition, is a linear organopolysiloxane having at least 2 (generally from 2 to 50), and especially about 2 to 20, silicon atom-bonded alkenyl groups per molecule. This is typically a linear diorganopolysiloxane in which the backbone is composed of repeating diorganopolysiloxane units and both ends of the molecular chain are capped with triorganosiloxy groups.

Component (A-2) is a three-dimensional network-type organopolysiloxane resin comprising $R^1_2R^2SiO_{1/2}$ units, $R^1_3SiO_{1/2}$ units and $SiO_2$ units (wherein $R^1$ is an unsubstituted or halogen-substituted monovalent hydrocarbon group exclusive of alkenyl, and $R^2$ is an alkenyl group) in a molar ratio of the sum of $R^1_2R^2SiO_{1/2}$ units and $R^1_3SiO_{1/2}$ units to $SiO_2$ units, expressed as $(R^1_2R^2SiO_{1/2}+R^1_3SiO_{1/2})/SiO_2$, of from 0.5 to 1.5, and preferably 0.7 to 1.0, and containing from $1\times10^{-4}$ to $50\times10^{-4}$ mol/g of alkenyl groups. In general, the organopolysiloxane resin having a three-dimensional network structure that serves as component (A-2) preferably contains no trifunctional siloxane units on the molecule, although it is clearly differentiated from the branched organopolysiloxane oligomer serving as the subsequently described component (D) in that it must contain $SiO_2$ units on the molecule.

In addition to the above units, the organopolysiloxane resin of component (A-2) may also contain $R^1_2SiO$ units, $R^1R^2SiO$ units, $R^2_2SiO$ units, $R^1SiO_{3/2}$ units and $R^2SiO_{3/2}$ units, the content of such units being preferably not more than 30% by weight (0 to 30% by weight), and especially not more than 20% by weight (0 to 20% by weight) of the organopolysiloxane resin of component (A-2). In order for the resin to be able to stably reinforce the cured product, it is preferable for the polystyrene-equivalent weight-average molecular weight, as determined by gel permeation chromatography, to be from 400 to 100,000, and especially from 500 to 30,000. When the weight-average molecular weight is too small, there may be no cured product reinforcing effect; when it is too large, stable production may not be possible.

The silicon atom-bonded alkenyl groups included in component (A) (that is, components (A-1) and (A-2)) are typically alkenyl groups having 2 to 8 carbon atoms, such as vinyl, allyl, butenyl, pentenyl, hexenyl or heptenyl, and preferably alkenyl groups having 2 to 6 carbon atoms. Vinyl is especially preferred.

With respect to the bonding positions of the alkenyl groups in component (A-1), that is, the positions of the silicon atom-bonded alkenyl groups in the molecule, alkenyl groups bonded to terminal silicon atoms and/or non-terminal silicon atoms on the molecular chain may be included, although it is preferable for at least alkenyl groups bonded to silicon atoms at both ends of the molecular weight to be included.

Examples of silicon atom-bonded organic groups other than alkenyl groups (e.g., unsubstituted or halogen-substituted monovalent hydrocarbon groups) in component (A) include unsubstituted or halogen-substituted monovalent hydrocarbon groups of generally about 1 to 10 carbon atoms, and preferably about 1 to 8 carbon atoms, including alkyl groups such as methyl, ethyl, propyl, butyl, pentyl, hexyl and heptyl; aryl groups such as phenyl, tolyl, xylyl and naphthyl; aralkyl groups such as benzyl and phenethyl; and halogenated alkyl groups such as chloromethyl, 3-chloropropyl and 3,3,3-trifluoropropyl. Methyl and phenyl are preferred.

Component (A-1) has a viscosity at 25° C. which is preferably in the range of 10 to 500,000 mPa·s, and especially 100 to 100,000 mPa·s, in order for the composition to be easy to handle and work (e.g., it has sufficient flowability) and for the resulting cured product to have good physical properties (e.g., hardness (flexibility), strength, elongation). In this invention, the viscosity can generally be measured with a rotational viscometer such as a BL, BH, BS or cone-and-plate type viscometer.

Examples of the organopolysiloxane serving as component (A-1) include dimethylsiloxane-methylvinylsiloxane copolymers capped at both ends of the molecular chain with trimethylsiloxy groups, methylvinylpolysiloxane capped at both ends of the molecular chain with trimethylsiloxy groups, dimethylsiloxane-methylvinylsiloxane-methylphenylsiloxane copolymers capped at both ends of the molecular chain with trimethylsiloxy groups, dimethylsiloxane-methylvinylsiloxane-diphenylsiloxane copolymers capped at both ends of the molecular chain with trimethylsiloxy groups, dimethylpolysiloxane-methylvinylpolysiloxane copolymers capped at one end of the molecular chain with a dimethylvinylsiloxy group and capped at the other end of the molecular chain with a trimethylsiloxy group, dimethylsiloxane-methylvinylpolysiloxane copolymers capped at both ends of the molecular chain with dimethylvinylsiloxy groups, dimethylsiloxane-methylvinylsiloxane-methylphenylsiloxane copolymers capped at both ends of the molecular chain with dimethylvinylsiloxy groups, dimethylsiloxane-methylvinylsiloxane-diphenylsiloxane copolymers capped at both ends of the molecular chain with dimethylvinylsiloxy groups, dimethylpolysiloxane capped at both ends of the molecular chain with divinylmethylsiloxy groups, dimethylpolysiloxane capped at both ends of the molecular chain with trivinylsiloxy groups, and mixtures of two or more of these organopolysiloxanes.

Examples of the organopolysiloxane resin serving as component (A-2) include organopolysiloxane copolymers consisting essentially of siloxane units of the formula $R^1_3SiO_{1/2}$, siloxane units of the formula $R^1_2R^2SiO_{1/2}$, units of the formula $R^1_2SiO$, and siloxane units of the formula $SiO_2$, organopolysiloxane copolymers consisting essentially of siloxane units of the formula $R^1_3SiO_{1/2}$, siloxane units of the formula $R^1_2R^2SiO_{1/2}$ and siloxane units of the formula $SiO_2$, organopolysiloxane copolymers consisting essentially of siloxane units of the formula $R^1_2R^2SiO_{1/2}$, siloxane units of the formula $R^1_2SiO$ and siloxane units of the formula $SiO_2$, and mixtures of two or more of these organopolysiloxanes.

In the above formulas, $R^1$ is an unsubstituted or halogen-substituted monovalent hydrocarbon group exclusive of alkenyl which is the same as described above. Examples include alkyl groups such as methyl, ethyl, propyl, butyl, pentyl, hexyl and heptyl; aryl groups such as phenyl, tolyl, xylyl and naphthyl; aralkyl groups such as benzyl and phenethyl; and halogenated alkyl groups such as chloromethyl, 3-chloropropyl and 3,3,3-trifluoropropyl. $R^2$ is an alkenyl group, examples of which include vinyl, allyl, butenyl, pentenyl, hexenyl and heptenyl. The compounding ratio of component (A-1) and (A-2), expressed as the weight ratio component (A-1)/component (A-2), is about 90/10 to 50/50, and preferably about 85/15 to 60/40. Within this range, the composition is easy to handle and work (e.g., it has sufficient flowability), and the cured product has optimal physical properties (e.g., hardness (flexibility), strength, elongation). Outside of this range, the composition is not easy to handle and work and the cured product does not have the desired physical properties, making accurate pattern transfer impossible.

[Component (B)]

Component (B) is an organohydrogenpolysiloxane having at least two silicon atom-bonded hydrogen atoms per molecule and containing no alkoxy groups on the molecule. In this composition, it acts as a crosslinking agent.

The organohydrogenpolysiloxane included as component (B) serves as a crosslinking agent by reacting with component (A) (i.e., components (A-1) and (A-2)). The molecular structure is not particularly limited. That is, use may be made of organohydrogenpolysiloxanes manufactured in the prior art that have a structure which is linear, linear with some branching, cyclic or a three-dimensional network (resinous). The organohydrogenpolysiloxane must have at least two, and preferably has three or more, silicon atom-bonded hydrogen atoms (hydrosilyl groups denoted as SiH) on the molecule. It is desirable for the molecule to have generally from 2 to 300, preferably from 3 to 200, and more preferably from 4 to 100, SiH groups. The organohydrogenpolysiloxane used may be one having the average compositional formula (1) below.

$$R^4_b H_c SiO_{(4-b-c)/2} \quad (1)$$

In formula (1) above, $R^4$ is a silicon-bonded substituted or unsubstituted monovalent hydrocarbon group of preferably 1 to 10 carbon atoms that is free of aliphatic unsaturation. Illustrative examples of this substituted or unsubstituted monovalent hydrocarbon group $R^4$ include alkyl groups such as methyl, ethyl, propyl, isopropyl, butyl, isobutyl, tert-butyl, pentyl, neopentyl, hexyl, cyclohexyl, octyl, nonyl and decyl; aryl groups such as phenyl, tolyl, xylyl and naphthyl; aralkyl groups such as benzyl, phenylethyl and phenylpropyl; and any of these groups in which some or all of the hydrogen atoms are substituted with halogen atoms such as fluorine, bromine or chlorine, such as chloromethyl, chloropropyl, bromoethyl and trifluoropropyl. This substituted or unsubstituted monovalent hydrocarbon group $R^4$ is preferably an alkyl group or aryl group, and more preferably methyl or phenyl. Also, b is a positive number from 0.7 to 2.1, c is a positive number from 0.001 to 1.0, and b+c is a positive number of from 0.8 to 3.0. Preferably, b is 1.0 to 2.0, c is 0.01 to 1.0, and b+c is 1.5 to 2.5.

The at least two, and preferably 3 or more, SiH groups included per molecule may be positioned at the ends of the molecular chain, positioned partway along the molecular chain, or positioned at both the ends of and partway along the molecular chain. The molecular structure of the organohydrogenpolysiloxane may be linear, linear with some branching, cyclic, branched, or a three-dimensional network. It is desirable for the number of silicon atoms on the molecule (or the degree of polymerization) to be generally about 2 to 300, preferably 3 to 200, and more preferably 4 to 100. In order for the composition to be easy to handle and work (such as having sufficient flowability) and for the resulting cured product to have good physical properties (e.g., hardness (flexibility), heat resistance), the use of an organohydrogenpolysiloxane which is liquid at room temperature (25° C.) and has a viscosity at 25° C. of generally about 1 to 1,000 mPa·s, and especially 5 to 500 mPa·s, is preferred.

In this invention, the degree of polymerization (or molecular weight) can be determined as, for example, the weight-average degree of polymerization (or weight-average molecular weight) in gel permeation chromatography (GPC) using toluene, for example, as the developing solvent. The viscosity can be measured at 25° C. with a rotational viscometer such as a BL, BH, BS or cone-and-plate type viscometer.

Illustrative examples of the organohydrogenpolysiloxane of component (B) having formula (1) include 1,1,3,3-tetramethyldisiloxane, 1,3,5,7-tetramethylcyclotetrasiloxane, tris(hydrogendimethylsiloxy)methylsilane, tris(hydrogendimethylsiloxy)phenylsilane, methylhydrogencyclopolysiloxane, methylhydrogensiloxane-dimethylsiloxane cyclic copolymers, methylhydrogenpolysiloxane capped at both ends with trimethylsiloxy groups, dimethylsiloxane-methylhydrogensiloxane copolymers capped at both ends with trimethylsiloxy groups, dimethylpolysiloxane capped at both ends with dimethylhydrogensiloxy groups, dimethylsiloxane-methylhydrogensiloxane copolymers capped at both ends with dimethylhydrogensiloxy groups, methylhydrogensiloxane-diphenylsiloxane copolymers capped at both ends with trimethylsiloxy groups, methylhydrogensiloxane-diphenylsiloxane-dimethylsiloxane copolymers capped at both ends with trimethylsiloxy groups, methylhydrogensiloxane-methylphenylsiloxane-dimethylsiloxane copolymers capped at both ends with trimethylsiloxy groups, methylhydrogensiloxane-dimethylsiloxane-diphenylsiloxane copolymers capped at both ends with dimethylhydrogensiloxy groups, methylhydrogensiloxane-dimethylsiloxane-methylphenylsiloxane copolymers capped at both ends with dimethylhydrogensiloxy groups, copolymers consisting essentially of $(CH_3)_2HSiO_{1/2}$ units, $(CH_3)_3SiO_{1/2}$ units and $SiO_{4/2}$ units, copolymers consisting essentially of $(CH_3)_2HSiO_{1/2}$ units and $SiO_{4/2}$ units, copolymers consisting essentially of $(CH_3)_2HSiO_{1/2}$ units, $SiO_{4/2}$ units and $(C_6H_5)_3SiO_{1/2}$ units, and any of these example compounds in which some or all methyl groups are replaced with another alkyl, phenyl or the like. Organohydrogenpolysiloxanes of molecular formula (2) below are especially preferred

[Chemical Formula 1]

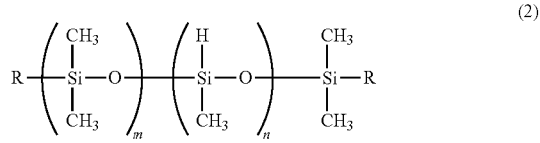

$$(2)$$

(wherein R is a hydrogen atom or methyl, m and n are integers such that 0≤m and 1≤n, and m+n is an integer of from 1 to 299).

Component (B) may be prepared by a known method. For example, in one general method, component (B) can easily be obtained by equilibrating octamethylcyclotetrasiloxane and/or tetramethylcyclodisiloxane with a compound containing a hexamethyldisiloxane or 1,1'-dihydro-2,2',3,3'-tetramethyldisiloxane unit capable of becoming an end group in the presence of a catalyst such as sulfuric acid, trifluoromethanesulfonic acid or methanesulfonic acid and at a temperature of about −10 to +40° C.

Component (B) is used in an amount such that the molar ratio of silicon atom-bonded hydrogen atoms in component (B) to the sum of alkenyl groups in the organopolysiloxanes of components (A) and (D) is from 0.5 to 6.0, and preferably from 1.0 to 5.0. At a molar ratio below 0.5 or above 6.0, the composition does not fully cure.

[Component (C)]

Component (C) used in the invention is a photoactive platinum complex catalyst. When activated by irradiation with light, it has a catalytic action that promotes addition reactions between components (A), (B) and (D). In this invention, the compound that serves as the photoactive platinum complex catalyst of component (C) is preferably a β-diketone platinum complex or a platinum complex having a cyclic diene compound as a ligand.

Illustrative examples of β-diketone platinum complexes include trimethyl(acetylacetonato)platinum complex, trimethyl(2,4-pentanedionate)platinum complex, trimethyl(3,5-heptanedionate)platinum complex, trimethyl(methylacetoacetate)platinum complex, bis(2,4-pentanedionato) platinum complex, bis(2,4-hexanedionato)platinum complex, bis(2,4-heptanedionato)platinum complex, bis(3, 5-heptanedionato)platinum complex, bis(1-phenyl-1,3-butanedionato)platinum complex and bis(1,3-diphenyl-1,3-propanedionato)platinum complex. Illustrative examples of platinum complexes having a cyclic diene compound as a ligand include (1,5-cyclooctadienyl)dimethyl platinum complex, (1,5-cyclooctadienyl)diphenyl platinum complex, (1,5-cyclooctadienyl)dipropyl platinum complex, (2,5-norbornadiene)dimethyl platinum complex, (2,5-norbornadiene)diphenyl platinum complex, (cyclopentadienyl)dimethyl platinum complex, (methylcyclopentadienyl)diethyl platinum complex, (trimethylsilylcyclopentadienyl)diphenyl platinum complex, (methylcycloocta-1,5-dienyl)diethyl platinum complex, (cyclopentadienyl)trimethyl platinum complex, (cyclopentadienyl)ethyldimethyl platinum complex, (cyclopentadienyl)acetyldimethyl platinum complex, (methylcyclopentadienyl)trimethyl platinum complex, (methylcyclopentadienyl)trihexyl platinum complex, (trimethylsilylcyclopentadienyl)trimethyl platinum complex, (dimethylphenylsilylcyclopentadienyl)triphenyl platinum complex and (cyclopentadienyl)dimethyltrimethylsilylmethyl platinum complex.

Component (C) should be included in an amount that is effective as a catalyst. For example, component (C) may be used in an amount, expressed in terms of the platinum metal with respect to the weight of component (A), of 1 to 5,000 ppm, and preferably 10 to 500 ppm. When less than 1 ppm is included, the addition reaction may be substantially retarded or curing may not occur.

[Component (D)]

The branched organopolysiloxane oligomer included as component (D) serves as a reinforcement in the inventive composition. It is an alkenyl group-containing branched organopolysiloxane oligomer comprising $R^1SiO_{3/2}$ units and either $R^1_2R^2SiO_{1/2}$ units or both $R^1_2R^2SiO_{1/2}$ and $R^1_3SiO_{1/2}$ units (wherein $R^1$ is an unsubstituted or halogen-substituted monovalent hydrocarbon atom exclusive of alkenyl, and $R^2$ is an alkenyl group), and preferably having two or more alkenyl groups per molecule. Component (D) is clearly differentiated from the three-dimensional network-type organopolysiloxane resin of component (A-2) above in that the molecule is free of $SiO_2$ units.

The proportion (molar ratio) of $R^1_2R^2SiO_{1/2}$ units or both $R^1_2R^2SiO_{1/2}$ units and $R^1_3SiO_{1/2}$ units with respect to $R^1SiO_{3/2}$ units, expressed as $(R^1_2R^2SiO_{1/2})/(R^1SiO_{3/2})$ or $(R^1_2R^2SiO_{1/2}+R^1_3SiO_{1/2})/(R^1SiO_{3/2})$, is preferably from 0.1 to 10, and more preferably from 0.5 to 5. The amount of alkenyl groups included in component (D) is preferably from 0.0001 to 0.05 mol/g, and more preferably form 0.0002 to 0.02 mol/g. When the amount of alkenyl groups is too small, the cured product reinforcing effect may weaken; when the amount is too large, the composition may not sufficiently cure. The viscosity as determined with a rotational viscometer at 25° C. is preferably in the range of 1 to 1,000 mPa·s, and more preferably in the range of 10 to 100 mPa·s.

Component (D) may be prepared by a known method. For example, in one general method, component (D) can easily be prepared by stirring a hydrolyzate of methyltrichlorosilane obtained with the aid of water or methanol with a hexamethyldisiloxane and/or tetramethyldivinyldisiloxane-containing compound in the presence of a catalyst such as sulfuric acid, trifluoromethanesulfonic acid or methanesulfonic acid and at a temperature of not above +50° C., and then adding water dropwise at a temperature of not above +65° C. to effect cohydrolysis.

Component (D) is included in an amount such that the molar ratio of alkenyl groups on component (D) to the sum of alkenyl groups on components (A) and (D) is from 0.01 to 0.6. At a molar ratio below 0.01, there may be no cured product reinforcing effect, whereas at more than 0.6 of the composition, the composition may not fully cure. The compounding ratio of components (A) and (D), expressed as the weight ratio component (A)/component (D), is preferably from 99.99/0.01 to 50/50, and more preferably from 99.95/0.05 to 60/40.

[Other Compounding Ingredients]

The inventive composition may include, as optional ingredients other than above components (A) to (D), a compound having an addition curing reaction suppressing and regulating effect (hydrosilylation reaction regulator). Examples of such compounds include phosphorus-containing compounds such as triphenylphosphine, nitrogen-containing compounds such as tributylamine, tetramethylethylenediamine and benzotriazole, sulfur-containing compounds, acetylene compounds, compounds having two or more alkenyl groups, hydroperoxy compounds and maleic acid derivatives. The degree of the cure-retarding effect by this compound varies greatly with the chemical structure. Accordingly, the amount of addition thereof should be adjusted to the optimal amount for the particular compound used. In general, however, when the amount of addition is too small, long-term storage stability at room temperature may not be obtained, whereas adding too much may inhibit the cure.

Other optional ingredients that may be used to an extent that does not detract from the transparency include inorganic fillers such as fumed silica and polyorganosilsesquioxane, and fillers obtained by surface-treating the foregoing fillers with an organosilicon compound such as an organoalkoxysilane compound, an organochlorosilane compound, an organosilazane compound or a low-molecular-weight siloxane compound.

In addition, agents that impart, for example, heat resistance or flame retardance may also be optionally included in the inventive composition.

[UV Cure]

It is desirable for the organopolysiloxane composition of the invention to be cured by exposure to 200 to 500 nm wavelength light. The lamp used for UV exposure is not particularly limited, provided that it emits UV radiation in a wavelength range of 200 to 500 nm. Examples of suitable lamps include low-pressure mercury vapor lamps, medium-pressure mercury vapor lamps, high-pressure mercury vapor lamps, xenon lamps, metal halide lamps and UV LED lamps. The exposure dose of UV light varies with the type and amount of the photoactive platinum complex used, but should be sufficient to activate the photoactive platinum complex. Exposure at a UV intensity of 10 to 1,000 mW/cm$^2$, and especially 20 to 400 mW/cm$^2$, for a period of 0.1 second to 5 minutes, and especially 0.5 second to about 1 minute, is preferred.

The resulting silicone cured product which is used as a master material for nanoimprinting, a pad material for printing on a curved surface, a blanket material for offset printing or a shape-forming material for 3D printing has a hardness, as measured with a Type A durometer, of generally at least 40, and especially at least 50, and has a tear strength (crescent type) of at least 1 kN/m, and especially at least 2 kN/m. The hardness upper limit should generally be no more than about 80, and especially no more than about 75, and the tear strength upper limit should generally be no more than about 10 kN/m, and especially no more than about 8 kN/m. The hardness and tear strength can be measured by the method described in JIS-K6249.

The ability to prevent expansion of the silicone cured product used as a master material for nanoimprinting, a pad material for printing on a curved surface, a blanket material for offset printing or a shape-forming material for 3D printing is determined by measuring the linear shrinkage after the cure relative to before the cure, with a smaller linear shrinkage being preferred. For the inventive composition, the linear shrinkage measured according to JIS-K6294 is generally not more than 0.5% (0 to 0.5%), and especially not more than 0.3% (0 to 0.3%).

EXAMPLES

The invention is illustrated more fully below by way of Working Examples and Comparative Examples, although these Examples are not intended to limit the invention. The viscosity results are measured values obtained with a rotational viscometer at 25° C., and the weight-average molecular weights are polystyrene-equivalent values obtained by gel permeation chromatography using toluene as the developing solvent. Parts are indicated by weight.

Details on and abbreviations for components (A) to (D) used in the Examples are given below. "Vi" stands for vinyl and "Me" for methyl.

Component (A-1):
- a-1: Dimethylpolysiloxane capped at both ends of the molecular chain with dimethylvinylsiloxy groups and having a viscosity of 1,000 mPa·s. Vinyl group content, 0.000125 mol/g.
- a-2: Dimethylpolysiloxane capped at both ends of the molecular chain with trivinylsiloxy groups and having a viscosity of 5,000 mPa·s. Vinyl group content, 0.00006 mol/g.

Component (A-2):
- a-3: Resinous copolymer consisting essentially of Me$_3$SiO$_{1/2}$ units, ViMe$_2$SiO$_{1/2}$ units and SiO$_2$ units (Me$_3$SiO$_{1/2}$ units+ViMe$_2$SiO$_{1/2}$ units)/SiO$_2$ units=0.85 (molar ratio). Vinyl group content, 0.0009 mol/g; weight-average molecular weight, 3,800.

Component (B):
Methylhydrogenpolysiloxane having SiH groups at both ends and on side chains (degree of polymerization, 64; SiH group content, 0.0112 mol/g), Component (C):
2-(2-Butoxyethoxy)ethyl acetate solution of bis(2,4-pentanedionato)platinum complex (concentration, 1 wt %).

Component (D):
Organopolysiloxane oligomer consisting essentially of MeSiO$_{3/2}$ units and Me$_2$ViSiO$_{1/2}$ units, containing 0.0054 mol/g of vinyl groups, having a weight-average molecular weight of 2,000, containing an average of about 12.5 vinyl groups per molecule, and having a viscosity of 24 mPa·s. (Me$_2$ViSiO$_{1/2}$ units)/(MeSiO$_{3/2}$ units)=1/1 (molar ratio).

Working Example 1

A UV-curable organopolysiloxane composition was prepared by uniformly mixing: 14 parts of component (a-1), 60 parts of component (a-2) and 26 parts of component (a-3) as component (A), and also 7.9 parts of component (B), 0.48 part of component (C), and 0.61 part of component (D). In the composition, the molar ratio of SiH groups in component (B) to the sum of the alkenyl groups in components (A) and (D), expressed as "H/Vi", was about 2.7; and the molar ratio of alkenyl groups in component (D) to the sum of the alkenyl groups in components (A) and (D) was about 0.10. The viscosity of the composition at 25° C., as measured with a BL-type viscometer at 60 rpm and using a No. 4 rotor, was 2.6 Pa·s.

This composition was poured into a mold and cured at room temperature (25° C.) under UV exposure conditions of 120 mW/cm$^2$ and 1.7 seconds (=200 mW/cm$^2$). Following UV exposure, the cured composition was cooled 1 hour at room temperature (25° C.) and then demolded. The linear shrinkage was determined in accordance with JIS-K6249.

In a separate procedure, the above composition was cast into a frame and cured under UV exposure conditions of 120 mW/cm$^2$ and 1.7 seconds to produce a 2 mm thick cured sheet. The hardness and tear strength (crescent) were measured in accordance with JIS-K6249. The results are shown in Table 1.

Comparative Example 1

A UV-curable silicone composition was prepared by uniformly mixing, as component (A), 17.4 parts of component (a-1), 62.3 parts of component (a-2) and 24.9 parts of component (a-3), and also, as component (B), 5 parts of a resinous copolymer consisting essentially of HMe$_2$SiO$_{1/2}$ units and SiO$_2$ units (HMe$_2$SiO$_{1/2}$ units/SiO$_2$ units=1.6 (molar ratio), SiH group content, 0.00915 mol/g; weight-average molecular weight, 1,230), 0.3 part of a cyclic organopolysiloxane oligomer consisting essentially of MeViSiO units (alkenyl group content, 0.0116 mol/g; viscosity, 3.45 mPa·s) as a regulator, and 0.05 part of a 2-ethylhexanol solution of chloroplatinic acid (Pt concentration, 2 wt %). In the composition, the molar ratio "H/Vi" of SiH groups in component (B) to alkenyl groups in component (A) was about 1.6. The viscosity of the composition at 25° C., as measured with a BL-type viscometer at 60 rpm and using a No. 4 rotor, was 3.5 Pa·s.

This composition was poured into a mold and cured under heating conditions of 150° C. and 30 minutes. The cured composition was left at rest for one hour at room temperature (25° C.) and then demolded. The linear shrinkage was determined in accordance with JIS-K6249.

In a separate procedure, the above composition was poured into a frame and cured under heating conditions of 150° C. and 30 minutes to produce a 2 mm thick cured sheet.

The hardness and tear strength (crescent) were measured in accordance with JIS-K6249. The results are shown in Table 1.

TABLE 1

|  | Working Example 1 | Comparative Example 1 |
|---|---|---|
| Hardness (Durometer A) | 54 | 50 |
| Tear strength (kN/m) | 2.8 | 3.0 |
| Linear shrinkage (%) | 0.1 | 2.6 |

The invention claimed is:

1. A UV-curable organopolysiloxane composition comprising:
   (A) 100 parts by weight of (A-1) 50 to 90% by weight, based on component (A), of a linear organopolysiloxane containing at least two silicon atom-bonded alkenyl groups per molecule, and (A-2) 10 to 50% by weight, based on component (A), of a three-dimensional network-type organopolysiloxane resin comprising $R^1_2R^2SiO_{1/2}$ units, $R^1_3SiO_{1/2}$ units and $SiO_2$ units (wherein $R^1$ is an unsubstituted or halogen-substituted monovalent hydrocarbon group exclusive of alkenyl, and $R^2$ is an alkenyl group) in a molar ratio of the sum of $R^1_2R^2SiO_{1/2}$ units and $R^1_3SiO_{1/2}$ units to $SiO_2$ units, expressed as $(R^1_2R^2SiO_{1/2}+R^1_3SiO_{1/2})/SiO_2$, of from 0.5 to 1.5, and containing from $1\times10^{-4}$ to $50\times10^{-4}$ mol/g of alkenyl groups, the sum of components (A-1) and (A-2) being 100% by weight;
   (B) an organohydrogenpolysiloxane containing at least two silicon atom-bonded hydrogen atoms per molecule but no alkoxy groups, in an amount that gives a molar ratio of silicon atom-bonded hydrogen atoms in component (B) to the sum of alkenyl groups in components (A) and (D) of from 0.5 to 6.0;
   (C) an effective amount of a photoactive platinum complex curing catalyst; and
   (D) an alkenyl group-containing organopolysiloxane oligomer comprising $R^1_2R^2SiO_{1/2}$ or $R^1_2R^2SiO_{1/2}$ and $R^1_3SiO_{1/2}$ units, and $R^1SiO_{3/2}$ units (wherein $R^1$ is an unsubstituted or halogen-substituted monovalent hydrocarbon group exclusive of alkenyl, and $R^2$ is an alkenyl group) but no $SiO_2$ units, in an amount that gives a molar ratio of alkenyl groups in component (D) to the sum of alkenyl groups in components (A) and (D) of from 0.01 to 0.6.

2. The UV-curable organopolysiloxane composition of claim 1, wherein the photoactive platinum complex catalyst is a β-diketone platinum complex or a platinum complex having a cyclic diene compound as a ligand.

3. The UV-curable organopolysiloxane composition of claim 2, wherein the photoactive platinum complex catalyst is one or more selected from the group consisting of trimethyl(acetylacetonato)platinum complex, trimethyl(2,4-pentanedionate)platinum complex, trimethyl(3,5-heptanedionate)platinum complex, trimethyl(methylacetoacetate) platinum complex, bis(2,4-pentanedionato)platinum complex, bis(2,4-hexanedionato)platinum complex, bis(2,4-heptanedionato)platinum complex, bis(3,5-heptanedionato) platinum complex, bis(1-phenyl-1,3-butanedionato)platinum complex, bis(1,3-diphenyl-1,3-propanedionato) platinum complex, (1,5-cyclooctadienyl)dimethyl platinum complex, (1,5-cyclooctadienyl)diphenyl platinum complex, (1,5-cyclooctadienyl)dipropyl platinum complexes, (2,5-norbornadiene)dimethyl platinum complex, (2,5-norbornadiene)diphenyl platinum complex, (cyclopentadienyl)dimethyl platinum complex, (methylcyclopentadienyl)diethyl platinum complex, (trimethylsilylcyclopentadienyl)diphenyl platinum complex, (methylcycloocta-1,5-dienyl)diethyl platinum complex, (cyclopentadienyl)trimethyl platinum complex, (cyclopentadienyl)ethyldimethyl platinum complex, (cyclopentadienyl)acetyldimethyl platinum complex, (methylcyclopentadienyl)trimethyl platinum complex, (methylcyclopentadienyl)trihexyl platinum complex, (trimethylsilylcyclopentadienyl)trimethyl platinum complex, (dimethylphenylsilylcyclopentadienyl)triphenyl platinum complex and (cyclopentadienyl)dimethyltrimethylsilylmethyl platinum complex.

4. The UV-curable organopolysiloxane composition of claim 1 which is for use in forming a master material for nanoimprinting, a pad material for printing on a curved surface, a blanket material for offset printing or a shape-forming material for 3D printing.

5. A method for producing a plate material selected from the group consisting of a master material for nanoimprinting, a pad material for printing on a curved surface, a blanket material for offset printing and a shape-forming material for 3D printing, the method comprising the steps of applying the UV-curable organopolysiloxane composition of claim 1 to a matrix on which is formed a fine pattern to be inverted; irradiating the applied organopolysiloxane composition with UV radiation to effect curing by a stereolithographic process; and removing the cured composition from the matrix, thereby inverting and forming the fine pattern of the matrix on the surface of the cured composition.

6. A plate material selected from the group consisting of a master material for nanoimprinting, a pad material for printing on a curved surface, a blanket material for offset printing and a shape-forming material for 3D printing, wherein the plate material comprises the UV-curable organopolysiloxane of claim 1 in a cured form having a linear shrinkage of not more than 0.5%.

* * * * *